United States Patent
Berge et al.

(10) Patent No.: US 10,223,320 B2
(45) Date of Patent: *Mar. 5, 2019

(54) ADJUSTING AN OPTIMIZATION PARAMETER TO CUSTOMIZE A SIGNAL EYE FOR A TARGET CHIP ON A SHARED BUS

(71) Applicant: International Business Machines Corporation, Armonk, NY (US)

(72) Inventors: Layne A. Berge, Rochester, MN (US); Benjamin A. Fox, Rochester, MN (US); Wesley D. Martin, Elgin, MN (US); George R. Zettles, IV, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 95 days.

This patent is subject to a terminal disclaimer.

(21) Appl. No.: 14/833,901

(22) Filed: Aug. 24, 2015

(65) Prior Publication Data

US 2017/0010999 A1    Jan. 12, 2017

Related U.S. Application Data

(63) Continuation of application No. 14/793,985, filed on Jul. 8, 2015.

(51) Int. Cl.
   *G06F 13/42*      (2006.01)
   *G06F 15/78*      (2006.01)
   (Continued)

(52) U.S. Cl.
   CPC ...... *G06F 13/4282* (2013.01); *G06F 13/1668* (2013.01); *G06F 13/4068* (2013.01); *G06F 15/7817* (2013.01); *G11C 2207/105* (2013.01)

(58) Field of Classification Search
   CPC ............ G06F 13/1668; G06F 13/4068; G06F 13/7817
   See application file for complete search history.

(56) References Cited

U.S. PATENT DOCUMENTS

| | | | | |
|---|---|---|---|---|
| 5,084,667 A | * | 1/1992 | Drori | G05B 19/075 323/298 |
| 5,194,765 A | * | 3/1993 | Dunlop | H03H 11/245 326/34 |

(Continued)

OTHER PUBLICATIONS

Authors et al., Virtual Scope Digital Eye Method for DDR Memory Writes: An IP.com Prior Art Database Technical Disclosure, Feb. 17, 2012, pp. 1-7, ip.com, Fairport, United States.

(Continued)

*Primary Examiner* — Henry Tsai
*Assistant Examiner* — John Roche
(74) *Attorney, Agent, or Firm* — Patterson + Sheridan, LLP

(57) ABSTRACT

The embodiments of the present disclosure identify a target chip from among multiple chips coupled to a shared bus and customize an optimization parameter for the particular chip. Stated differently, in a communication system where only one chip (or a subset of chips) on a shared bus is the intended target, the system can customize an optimization parameter for the specific location of the target chip on the bus. As new data is received that is intended for a different chip—i.e., the target chip changes—the system can dynamically change the parameter based on the location of the new target chip on the bus.

7 Claims, 7 Drawing Sheets

(51) Int. Cl.
*G06F 13/16* (2006.01)
*G06F 13/40* (2006.01)

(56) References Cited

U.S. PATENT DOCUMENTS

| | | | |
|---|---|---|---|
| 5,828,824 | A | 10/1998 | Swoboda |
| 5,848,278 | A | 12/1998 | Sakai |
| 6,191,633 | B1 | 2/2001 | Fujii et al. |
| 6,191,663 | B1 | 2/2001 | Hannah |
| 6,230,217 | B1 | 5/2001 | Tuccio et al. |
| 6,321,282 | B1* | 11/2001 | Horowitz ............ G06F 13/4072 326/30 |
| 6,510,099 | B1 | 1/2003 | Wilcox et al. |
| 6,807,650 | B2 | 10/2004 | Lamb et al. |
| 7,088,127 | B2* | 8/2006 | Ngyuen ............ H03K 19/0005 326/30 |
| 7,165,185 | B2 | 1/2007 | Li et al. |
| 7,643,213 | B2 | 1/2010 | Boettiger et al. |
| 7,843,213 | B1 | 11/2010 | Linder et al. |
| 8,037,375 | B2 | 10/2011 | Schaefer |
| 8,825,965 | B2 | 9/2014 | Mazzola et al. |
| 2003/0001618 | A1 | 1/2003 | Haycock et al. |
| 2003/0140208 | A1* | 7/2003 | LaBerge ............ G06F 13/1694 711/170 |
| 2004/0044808 | A1 | 3/2004 | Salmon et al. |
| 2005/0088896 | A1 | 4/2005 | Yeh |
| 2006/0291263 | A1* | 12/2006 | Wallner ................ G11O 5/063 365/63 |
| 2007/0115954 | A1 | 5/2007 | Wu et al. |
| 2008/0197877 | A1 | 8/2008 | Cox et al. |
| 2012/0250436 | A1 | 10/2012 | Cho |
| 2012/0265930 | A1 | 10/2012 | Oh et al. |
| 2012/0296598 | A1 | 11/2012 | Chafin et al. |
| 2014/0082260 | A1 | 3/2014 | Oh et al. |
| 2014/0089716 | A1 | 3/2014 | Kishi |
| 2014/0181339 | A1 | 6/2014 | Hopgood et al. |
| 2014/0229687 | A1 | 8/2014 | Grunzke |
| 2014/0347108 | A1 | 11/2014 | Zerbe et al. |
| 2014/0359190 | A1* | 12/2014 | Metzner ............. G06F 11/3027 710/306 |
| 2015/0188498 | A1 | 7/2015 | Yuan et al. |
| 2015/0301977 | A1* | 10/2015 | Gervasi ............. G06F 13/4234 711/105 |
| 2016/0188498 | A1* | 6/2016 | Shaeffer ................ G11O 5/025 710/305 |
| 2017/0010985 | A1 | 1/2017 | Berge et al. |

OTHER PUBLICATIONS

Shin, Woo-Yeol et al., 4-Slot, 8-Drop Impedance-Matched Bidirectional Multidrop DQ Bus With a 4.8-Gb/s Memory Controller Transreceiver, IEEE Transactions on Components, Packaging and Manufacturing Technology, vol. 3, No. 5, May 2013, pp. 858-869, IEEE, Piscataway, United States.

Koo, Jabeom et al., Small-Area High-Accuracy ODT/OCD by calibration of Global On-Chip for 512M GDDR5 application, IEEE 2009 Custom Intergrated Circuits Conference (CICC), pp. 717-720, IEEE, Piscataway, United States.

Authors et al., IBM, Method and Structure for Optimizing the Read Valid Data Window in an Addessable Memory Device Using Output Driver Impedance Adjustment: An IP.com Prior Art Database Technical Disclosure, Jun. 21, 2003, pp. 1-5, ip.com, Fairport, United States.

IBM "List of IBM Patents or Patent Applications Treated As Related".

U.S. Application entitled Adjusting an Optimization Parameter to Customize a Signal Eye for a Target Chip on a Shared Bus, filed Jul. 8, 2015.

Lin, Charles C. "What's a Tri-state Buffer". CMSC311. University of Maryland. Published Summer 2003. <http://www.cs.u md. edu/class/su m2003/cmsc311 /Notes/CompOrg/tristate. html>.

IBM, "List of IBM Patent and Patent Applications Treated as Related," for U.S. Appl. No. 14/833,901 as filed on May XXXX, 2018.

* cited by examiner

| | 15 ohm | 15 ohm | 40 ohm | 30 ohm | 20 ohm | 20 ohm | 20 ohm |
|---|---|---|---|---|---|---|---|
| TARGET DRAM | 15 ohm/100ps | 15 ohm/500ps | 15 ohm/100ps | 15 ohm/50ps | 15 ohm/50ps | 10 ohm/50ps | 20 ohm/50ps |
| DRAM 01 | | X | | | | | |
| DRAM 02 | | | | | X | | |
| ... | | | | ... | | | |
| DRAM 03 | | | | | | X | |

FIG. 8

ADJUSTING AN OPTIMIZATION PARAMETER TO CUSTOMIZE A SIGNAL EYE FOR A TARGET CHIP ON A SHARED BUS

CROSS-REFERENCE TO RELATED APPLICATIONS

This application is a continuation of co-pending U.S. patent application Ser. No. 14/793,985, filed Jul. 8, 2015. The aforementioned related patent application is herein incorporated by reference in its entirety.

BACKGROUND

The present invention relates to adjusting a signal eye, and more specifically, to adjusting the signal eye upon identifying a target chip coupled to bus shared by multiple chips.

When designing traditional DDR3 fly-by nets, control settings such as the I/O impedance and slew rate of a driver are set depending on the distances of the DRAM modules from the driver. Generally, for an increasing number of loads on a fly-by net, the driver impedance is set lower and the slew rate is set higher. If the DRAM modules are too close (electrically) to the driver, the received signal at these modules may have a poor signal eye which results in incorrectly latched data. The typical solution is to add electrical length between the driver and the first DRAM module on the net, which causes the chain of DRAM modules to appear more like a single load from the perspective of the driver. Although this improves the signal quality at the DRAM module closest to the driver, the extra trace length causes more attenuation in the signal as it propagates down the net. As a result, the last DRAM module on the net may receive a degraded signal eye that is below receiver thresholds. As data transmission rates increase, identifying suitable control settings that permit all the DRAM modules on the fly-by net to properly receive the signal becomes a difficult, if not impossible task.

SUMMARY

One embodiment of the present invention is a method that includes receiving data to transmit on a shared bus, wherein a plurality of chips is coupled to the shared bus. The method also includes evaluating the received data to identify at least one target chip of the plurality of chips, wherein the target chip is an intended recipient of the received data. The method includes adjusting a resistance value of a dynamic termination resistor based upon a location of the target chip on the shared bus, where the termination resistor is coupled to a first end of the shared bus and a driver is coupled to a second end of the shared bus opposite the first end. The method includes transmitting the received data on the shared bus using the driver and the adjusted resistance value.

Another embodiment of the present invention is a system that includes a shared bus driver, a plurality of chips coupled to respective locations along the shared bus, a driver coupled to a first end of the shared bus, a dynamic termination resistor coupled to a second end of the shared bus, and configuration logic. The configuration logic is configured to evaluate received data to identify at least one target chip of the plurality of chips, where the target chip is an intended recipient of the received data and adjust a resistance value of the termination resistor based upon a location of the target chip on the shared bus before the driver transmits the received data on the shared bus.

Another embodiment of the present invention is a computer program product for a communication system that includes a computer-readable storage medium having computer-readable program code embodied therewith. The computer-readable program code is executable by one or more computer processors to receive data to transmit on a shared bus, wherein a plurality of chips is coupled to the shared bus and evaluate the received data to identify at least one target chip of the plurality of chips, where the target chip is an intended recipient of the received data. The program code is executable to adjust a resistance value of a dynamic termination resistor based upon a location of the target chip on the shared bus, where the termination resistor is coupled to a first end of the shared bus and a driver is coupled to a second end of the shared bus opposite the first end. The program code is executable to transmit the received data on the shared bus using the driver and the adjusted resistance value.

BRIEF DESCRIPTION OF THE SEVERAL VIEWS OF THE DRAWINGS

FIG. 8 illustrates a data structure for identifying optimization parameters in a DRAM memory system corresponding to target DRAMs, according to one embodiment described herein.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
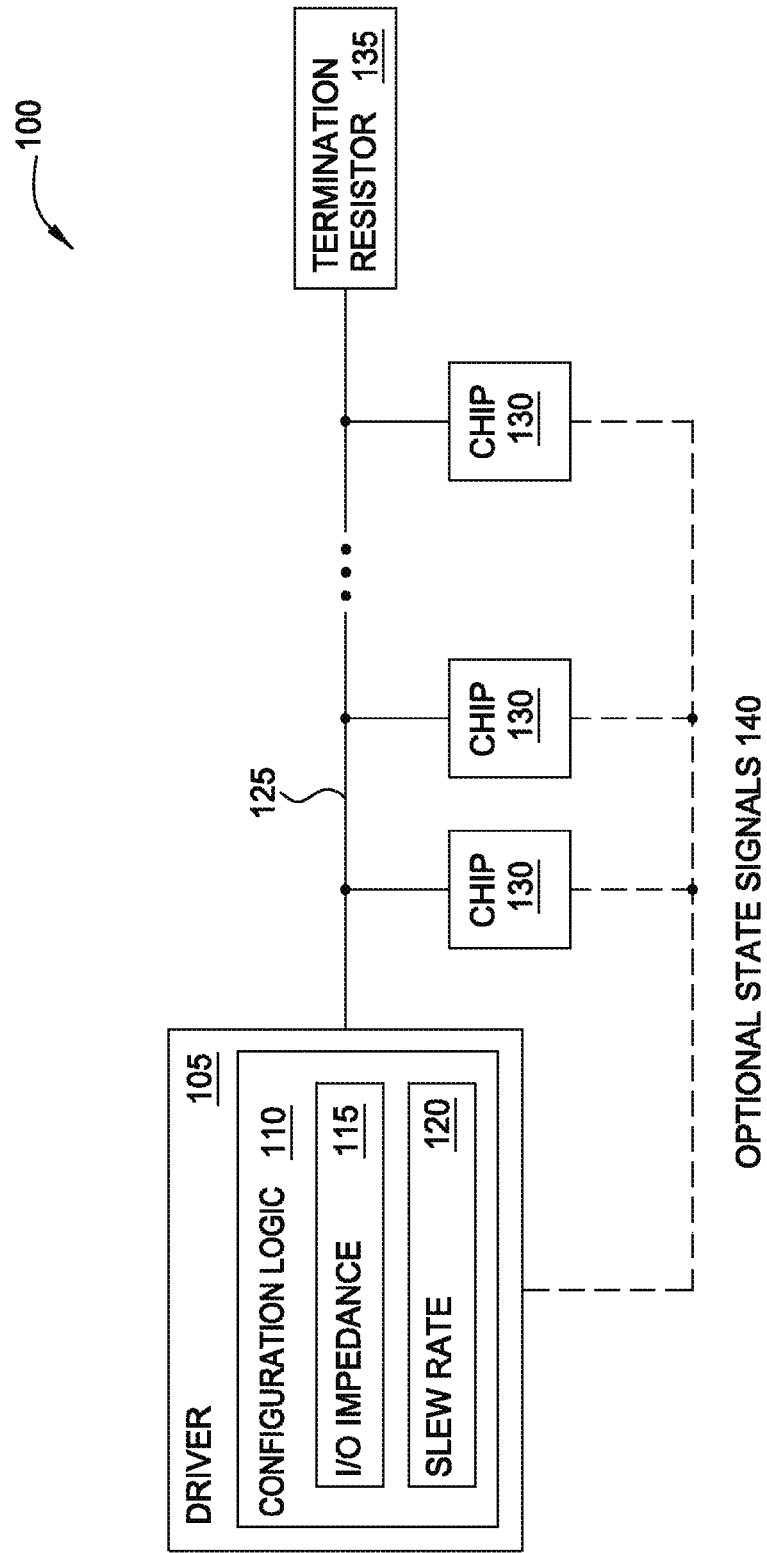
FIG. 1 illustrates a communication system with multiple chips coupled to a shared bus, according to one embodiment described herein.

Instead of identifying optimization parameters for all the chips coupled to a shared bus to accurately receive transmitted data, the embodiments of the present disclosure identify a target chip on the shared bus and then optimize a parameter for the particular chip. Stated differently, in a communication system where only one chip (or a subset of chips) on a shared bus is the intended target, the system customizes an optimization parameter based on the specific location of the target chip on the shared bus. As new data that is intended for a different chip is received—i.e., the target chip changes—the system can dynamically change the optimization parameters based on the location of the new target chip on the bus. Thus, even if the current optimization parameters result in a signal eye that does not satisfy receiver thresholds at the other chips coupled to the shared bus—i.e., non-target chips—this does not matter since the data is only intended for the target chip.

In one embodiment, the communication system includes a driver that transmits a data signal onto a shared bus coupled to multiple semiconductor chips. In one example, the chips may be memories such as DRAM memory modules or NAND flash. Moreover, the shared bus may be used to transmit command/address data or data information to be stored in the memories (e.g., DQ signals). In one embodiment, the communication system may change an I/O impedance of the driver and/or its slew rate (referred to herein as "control settings") depending on which chip is the intended target of a data transmission. If the target chip is the chip closest to the driver, the driver impedance may be set to 20 ohms with a slew rate of 500 ps. If the target chip is the chip furthest from the driver on the shared bus, the impedance and slew rate may be changed to 15 ohms and 50 ps, respectively. Additionally or alternatively, the communication system may dynamically change a termination resistance depending on which of the chips is the target for the data transmission. For example, a dynamic termination resistor (e.g., a digitally controlled potentiometer) may be disposed on an end of the shared bus opposite the end coupled to the driver. Depending on which chip is the target, the system may change the resistance value of the termination resistor to optimize the signal eye at the location of the target chip on the shared bus.

In another embodiment, the communication system may include multiple dynamic resistors coupled to the shared bus which each correspond to one of the chips. When a target chip is identified, the communication system may set the value of the dynamic resistor corresponding to the target chip to a specific resistance value. Moreover, the communication system may alter the resistance values of the other dynamic resistors so that the signal eye at the target chip is improved. Additionally or alternatively, the system may disable the other non-target chips (e.g., switch the chip to a Hi-Z mode). The communication system may modify all, or a subset of, the optimization parameters discussed above (e.g., I/O impedance, slew rate, a termination resistor, dynamic resistors coupled to each chip, or signals to activate/deactivate the chips) to optimize signal quality at the location of the target chip on the shared bus.

FIG. 1 illustrates a communication system 100 with multiple chips 130 coupled to a shared bus 125, according to one embodiment described herein. In addition, system 100 includes a driver 105 and a termination resistor 135 coupled to respective ends of the shared bus 125. The system 100 may also include state signals 140 for selectively activating and deactivating the chips 130 (e.g., switching the chips 130 from a Hi-Z mode (inactive) to a Low-Z mode (active)), although this is not a requirement.

In one embodiment, the communication system 100 may be memory system (e.g., DRAM or NAND flash) where command/address data or DQ signals are transmitted from the driver 105 to a chip 130. However, the embodiments herein may be used in any communication system 100 where only one chip (or a subset of the chips) coupled to the shared bus is the intended target of a data transmission from the driver 105. For example, the communication system 100 may be used to perform Ethernet communication to transmit network packets to different targets (e.g., chips 130) when the packet is intended for a subset of the targets connected to the bus.

In one embodiment, the chips 130 are attached to different locations of the shared bus 125 such that the chips 130 are different distances from the driver 105 and the termination resistor 135. These distances refer to the length of the shared bus 125 (e.g., a trace length) that separates a particular chip 130 from the driver 105, the termination resistor 135, or another chip 130. Although shown as being a straight line, the shared bus 125 may have any number of bends or curves. Thus, it is possible that the shared bus 125 may have an arrangement where the closest chip 130 to the driver 105 according to the length of the shared bus 125 may actually be further from the driver 105 than another chip 130 if direct paths where used to compare distances between the driver 105 and the chips 130.

In one embodiment, when transmitting a data transmission, the driver 105 sends the data to all the chips 130 indiscriminately. Put differently, the system 100 does not include any switching logic that permits only a subset of the chips 130 coupled to the shared bus 125 to receive the data transmission. Instead, the data transmission is received on all of the chips 130. However, because of the different locations of the chips 130 on the bus 125, the signal quality of the data transmission (i.e., the signal eye) varies for the chips 130. For example, back reflections and/or attenuation may affect the data transmission at the various locations of the chips 130 differently. Thus, the quality of the data transmission at the chip 130 closest to the driver 105 may be different than the quality of the data transmission at the chip 130 furthest from the driver 105. Moreover, the speed at which the driver 105 transmits the data transmission also affects the back reflections and/or attenuation thereby affecting the signal quality at the locations of the bus 125 coupled to the chips 130.

To account for the signal quality at the various locations along the shared bus 125, the system 100 may attempt to balance control settings in the driver 105 and the termination resistor 135 so that the signal eye at the various chip locations on the bus 125 is sufficient for each chip to receive data. That is, all the chips 130 can receive and process the data transmission even if the chip 130 is not the intended target of the data transmission. However, fixing the control settings so that all the chips 130 can receive the data transmission may limit the speeds at which the driver 105 can transmit the data. For example, all the chips 130 may be able to accurately receive the data transmission at 1600 mega-transfers/second, but for the same control settings, only a portion of the chips 130 can accurately receive the data if the data rate is increased to 2100 mega-transfer/second. Instead of using static control settings which are set so that all the chips 130 can receive the data transmission, the communication system 100 dynamically adjusts the control settings of the driver 105 using the location of the intended target chip 130 on the shared bus 125 even if doing so means some of the chips 130 on the bus 125 are unable to accurately receive the data transmission.

The driver 105 includes configuration logic 110 for identifying the intended target for a received data transmission (i.e., a particular chip 130 or chips 130) and adjusting the control settings of the driver 105 accordingly. The configuration logic 110 stores an I/O impedance value 115 and slew rate value 120 for the driver 105. The driver 105 may receive data from an upstream source (not shown) such as a host processor or memory controller which is intended for only one of the chips 130. The configuration logic 110 may process the received data to identify which of the chips 130 is the target chip. Once identified, the configuration logic 110 may reference an internal or external memory to identify control settings corresponding to the target chip. The configuration logic 110 may update the I/O impedance 115 or slew rate 120 settings (or both) of the driver 105 according to the predefined settings. In this manner, the configuration logic 110 optimizes one or more control settings of the driver 105 (i.e., the driver's I/O impedance 115 or slew rate 120) to adjust the signal quality of the data transmission for the particular location of the target chip 130 on the shared bus 125.

The configuration logic 110 may be firmware, hardware, software, or some combination thereof. Moreover, as shown as being part of the driver 105, in other embodiments, the configuration logic 110 may be located on a separate integrated circuit from the driver 105, or on a controller (e.g., a memory controller) separate from the driver 105.

Figure 2:
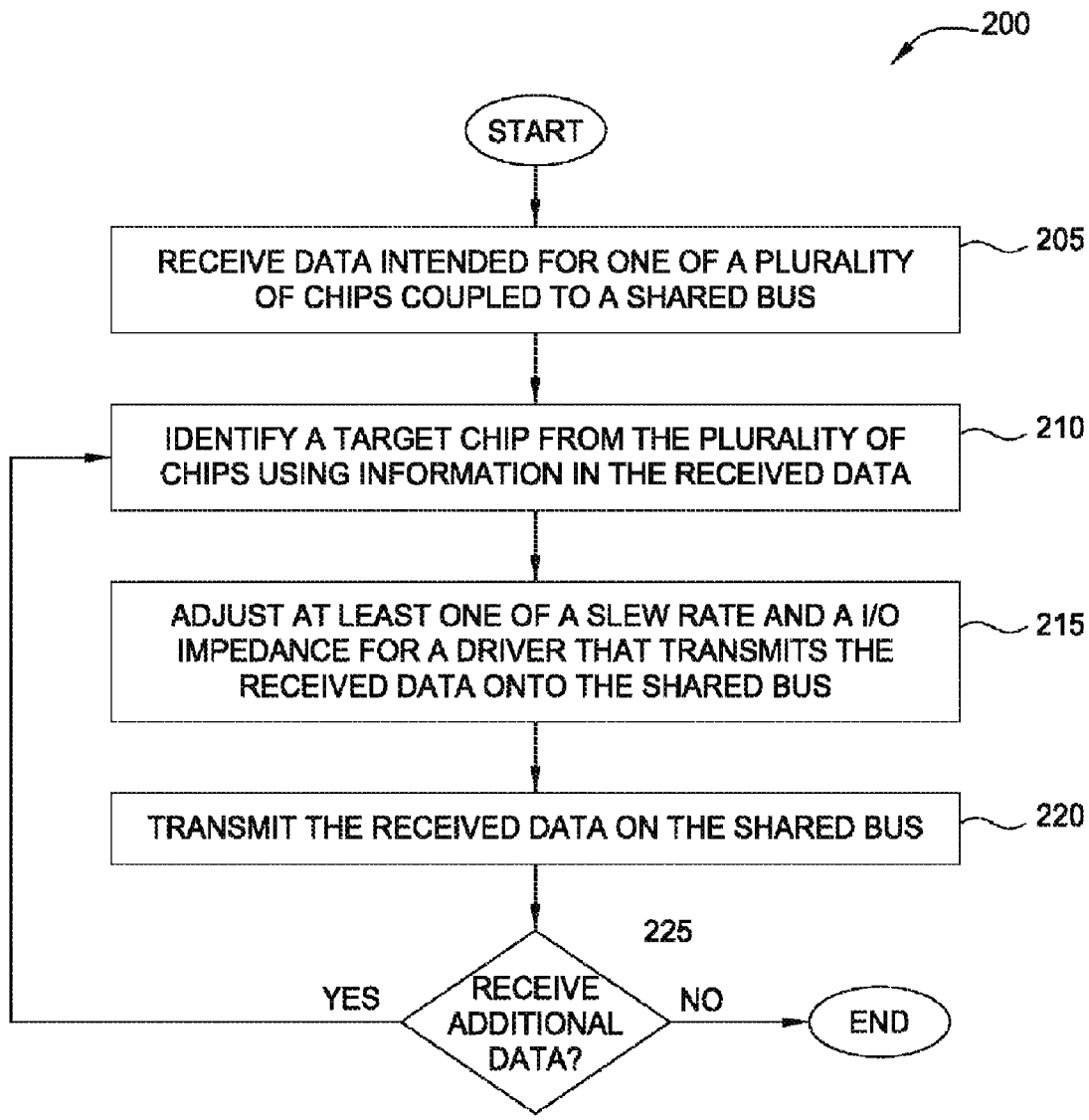
FIG. 2 is a flow chart for adjusting driver control settings upon identifying a target chip on the shared bus, according to one embodiment described herein.

FIG. 2 is a flow chart illustrating a method 200 for adjusting driver control settings upon identifying a target chip on the shared bus, according to one embodiment described herein. The method 200 begins at block 205 where a driver receives data intended for one of the plurality of chips coupled to a shared bus. In one embodiment, the data may be intended for only one of the plurality of chips. Alternatively, the data may be intended for a subset of the plurality of chips—e.g., two out of four chips. As described above, the data may be a command/address data for a particular memory chip, or DQ data to be stored on the chip. Alternatively, the data may be an Ethernet communication packet destined for a processor chip or controller chip coupled to the shared bus.

At block 210, configuration logic identifies a target chip from the plurality of chips using information in the received data. For example, the received data may include a chip number or identifier which specifies one of the chips coupled to the shared bus. Alternatively, the received data may include address data which the configuration logic uses to identify the chip. For example, different blocks of addresses may be assigned to the chips, and thus, by identifying which block includes the address in the received data, the configuration logic can identify the target chip. In another example, the configuration logic may evaluate a packet header for identifying the destination of the packet—i.e., the target chip.

At block 215, the configuration logic adjusts the slew rate and/or the I/O impedance for the driver which transmits the received data onto the data bus. For example, the configuration logic may update internal registers that set the I/O impedance (e.g., 15 ohms, 20 ohms, 30 ohms, etc.) and the slew rate (e.g., 50 ps, 100 ps, 500 ps, etc.) for the driver. Stated differently, the configuration logic can adjust these control settings in response to identifying the target chip and its location on the shared bus.

In one embodiment, the configuration logic may perform a testing or configuration phase when a communication system is first powered on. The configuration logic may test the different possible combinations of the I/O impedances and slew rates for the driver and see which combinations result in the chips accurately receiving test data and for which data transmission rates. For example, the configuration logic may determine that a first chip accurately receives test data transmitted at a rate of 1600 mega-transfers/sec when a I/O impedance of 15 ohms and 500 ps is used but a second chip does not. Instead, the second chip may need an impedance of 20 ohms and 100 ps to accurately receive the data at the transmission rate. The configuration logic may identify the control settings for the chips in the bus for multiple different data transmission rates—e.g., 1600, 1800, and 2100 mega-transfers/second. This information may be stored in a memory in the configuration logic which can then be referenced at block 215.

In another embodiment, the optimized control settings for the different chips may be pre-loaded into the configuration logic instead of performing a testing or calibration phase when the communication system is powered on. For example, a technician may use testing equipment or a simulator to determine the control settings that yield the best signal quality (i.e., the best signal eye) for each of the chip locations on the shared bus for the various data transmission rates and store these control settings into the configuration logic before the communication system is shipped to the customer.

In one embodiment, the control settings may be set for a group of chips rather than for each individual chip. For example, instead of a single row of chips 130 as shown in FIG. 1, the system 100 may include multiple rows of chips 130 in a split fly-by topology which is shown in FIG. 7B. The control settings may be set depending on which row the target chip is in. Stated differently, the configuration logic may have different control settings for each row rather than for each chip. Thus, the control settings may be the same regardless of which chip in the row is the target chip.

At block 220, the driver transmits the received data on the shared bus. Thus, each of the chips coupled to the shared bus receive the signal generated by the driver although it may be the case that only a subset of the chips can accurately decode the data represented by the signal. For example, the signal quality of the data transmission may be insufficient to permit one or more of the chips to read the digital data. For example, the signal eye may be closed at some locations along the shared bus thereby prohibiting the chips coupled to these locations from decoding the data transmission signal. However, so long as the intended target (or targets) can accurately identify the digital data in the data transmission, the fact the signal quality may be too poor for the non-target chips to receive the data does not matter.

At block 225, the configuration logic determines if additional data is received from a source. If not, method 200 ends. However, if additional data is received, method 200 returns to block 210 to determine the target chip for the new received data. The configuration logic can adjust the control settings based on the new target chip (assuming the new target chip corresponds to different control settings than the current control settings of the driver). In this manner, method 200 dynamically adjusts the control settings of the driver as the target chip for the data transmitted on the shared bus changes.

Figure 3:
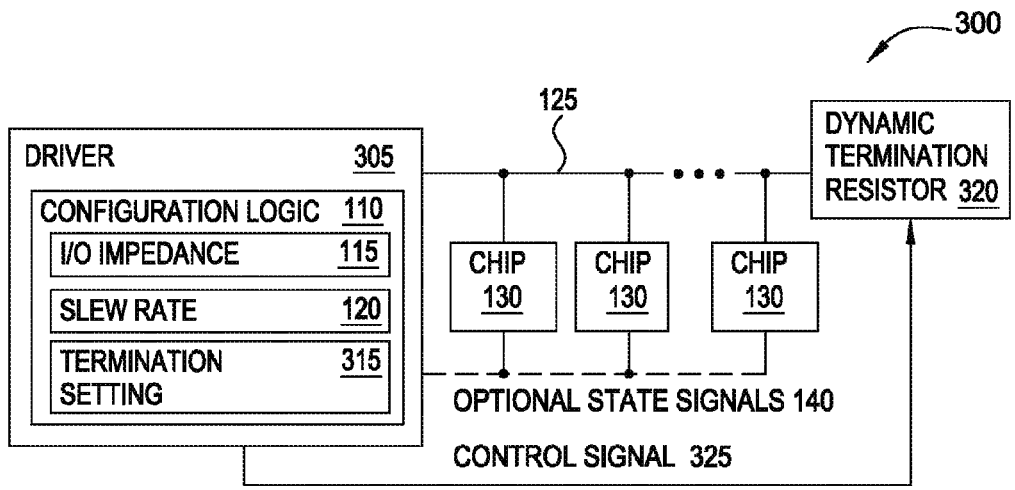
FIG. 3 illustrates a communication system with multiple chips coupled to a shared bus, according to one embodiment described herein.

FIG. 3 illustrates a communication system 300 with multiple chips 130 coupled to a shared bus 125, according to one embodiment described herein. The system 300 is similar to the communication system 100 in FIG. 1 except that system 300 includes a dynamic termination resistor 320 and control signal 325. Unlike a static resistor, the resistance value of the dynamic termination resistor 320 can change in response to the control signal 325. For example, configuration logic 310 may use the control signal 325 to change the resistance value of the dynamic termination resistor 320 from 40 ohms to 20 ohms, or vice versa.

Like in FIG. 1, the configuration logic 110 can adjust the I/O impedance 115 and slew rate 120 for the driver 305 depending on which chip 130 is the target chip. In addition, the configuration logic 110 includes a termination setting 315 which sets the resistance value of the dynamic termination resistor 320. In one embodiment, once the target chip is identified, the configuration logic 110 determines a resistance value of the resistor 320 that corresponds to the target chip and uses the termination setting 315 and control signal 325 to dynamically adjust the resistance value of the termination resistor 320. For example, the logic 110 may set the resistance value of the termination resistor 320 to 30 ohms when the chip 130 closest to the driver 305 is the target chip but change the resistance value to 15 ohms when the chip 130 furthest from the driver 305 is the target chip.

As shown, the control signal 325 is transmitted along a communication link that is separate from the shared bus 125. Thus, the driver 305 may use a different communication technique to transmit the control signal 325 than data on the shared bus 125. As such, the driver 305 may use a different data interface to transmit the control signal 325 to the termination resistor 320 than the data interface used to transmit received data on the shared bus 125. The speed at which the driver 305 transmits the control signals 325 may be the same or slower than the speed at which data signals are transmitted on the shared bus 125.

In one embodiment, the configuration logic 110 may dynamically adjust the termination resistor 320 without dynamically adjusting the control settings of the driver 305—e.g., the impedance 115 and slew rate 120. For example, those values may be fixed regardless of which chip 130 is the target chip, and the configuration logic 110 instead varies the resistance value of the termination resistor 320 as the target chip various. However, being able to vary both the control settings of the driver 305 and the dynamic termination resistor 320 based upon identifying the target chip may be preferred since this might enable the driver 305 to transmit at high data transmission speeds. Nonetheless, it may be cheaper to manufacture the communication system 300 if it adjusts only one of the control settings of the driver 305 or the resistance value of the termination resistor 320.

The system 100 may also include state signals 140 for selectively activating and deactivating the chips 130 (e.g., switching the chips 130 from a Hi-Z mode (inactive) to a Low-Z mode (active)), although this is not a requirement. For example, the configuration logic 310 may deactivate the non-target chips 130 while leaving the target chip activated. Doing so may improve the signal quality of the transmitted data at the location of the target chip on the shared bus 125. Moreover, although the configuration logic 110 is shown as being disposed on the driver 305, this is not a requirement.

Figure 4:
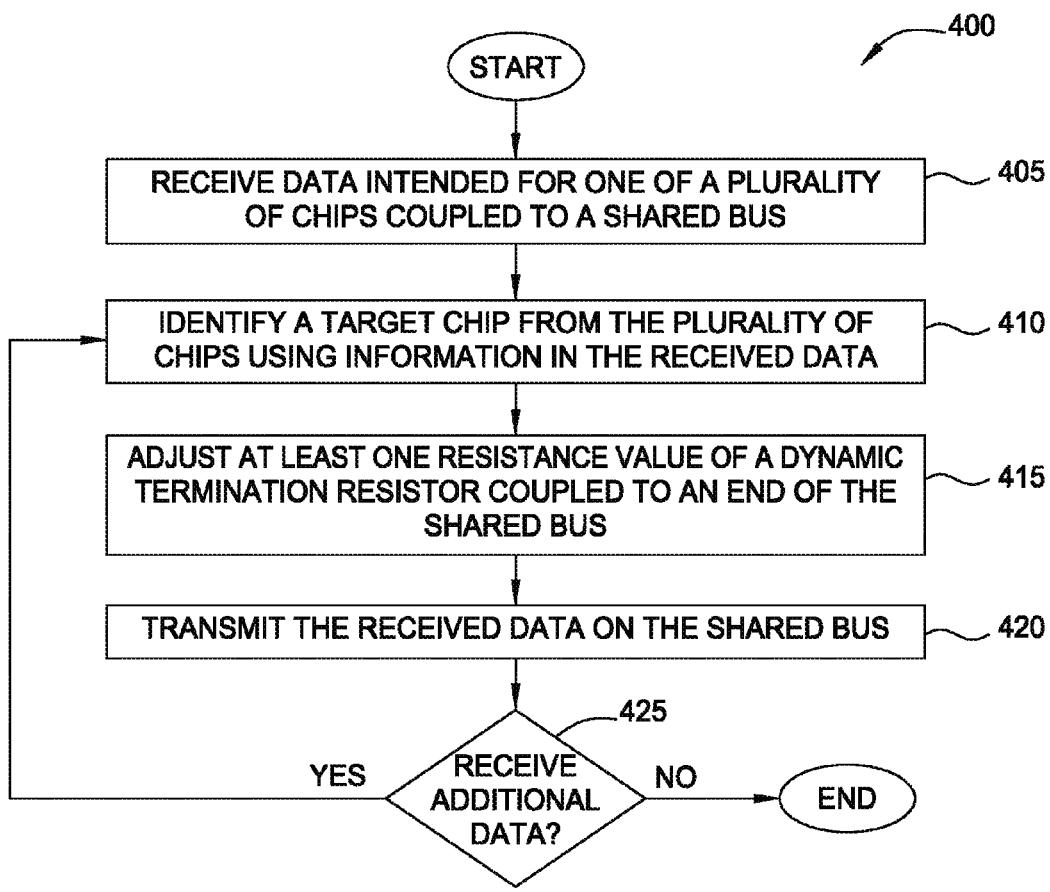
FIG. 4 is a flow chart for adjusting a dynamic termination resistor upon identifying a target chip on the shared bus, according to one embodiment described herein.

FIG. 4 is a flow chart illustrating a method 400 for adjusting a dynamic termination resistor upon identifying a target chip on the shared bus, according to one embodiment described herein. Blocks 405 and 410 may be the same as blocks 205 and 210 in FIG. 2, and thus, will not be described in detail here.

At block 415, configuration logic adjusts at least one resistance value of the dynamic termination resistor coupled to an end of the shared bus based on the target chip. That is, the configuration logic changes the dynamic termination resistor to a resistance value that corresponds to the target chip. For example, the configuration logic may perform a testing or configuration phase when the communication system 300 shown in FIG. 3 is first powered on. The configuration logic may test the different possible resistance values of the termination resistor to determine which of the chips accurately receive the test data at one or more data transmission rates. For example, the configuration logic may determine that the first chip accurately receives test data transmitted at a rate of 1600 mega-transfers/sec when the termination resistor has an impedance of 15 ohms but the second chip does not. Instead, the second chip may need a termination resistance of 20 ohms to accurately receive data at this data transmission rate. The configuration logic may identify the termination resistance values for each of the chips on the shared bus for the different data transmission rates—e.g., 1600, 1800, and 2100 mega-transfers/second. This information may be stored in a memory in the configuration logic which can then be referenced at block 415. Alternatively, the mapping of resistance values to the chips may be pre-loaded into the configuration logic rather than performing a testing or calibration phase. Moreover, as discussed above, the configuration logic may also change the I/O impedance and/or slew rate of the driver in addition to adjusting the termination resistance upon identifying the target chip.

In one embodiment, the configuration logic uses a communication link separate from the shared bus 125 to adjust the termination resistor to the resistance value that corresponds to the target chip. For example, the communication system may include a separate trace that connects an integrated circuit on which the configuration logic is disposed to the dynamic termination resistor. However, in other embodiments, it may be possible to adjust the value of the termination resistor using the shared bus if, for example, the target chip has a communication link to the termination resistor for adjusting its resistance.

At block 420, the driver transmits the receiver data on the shared bus with the new adjusted resistance value of the dynamic termination resistor. In one embodiment, the quality of the signal at one or more of the non-target chips on the shared bus may be below receiver thresholds. Thus, these chips may ignore the signal. However, since they are not the target for the transmitted data, this result is acceptable. Moreover, by adjusting the dynamic termination resistor in response to identifying the target chip (or chips), the transmission data rate may exceed what would be possible if the system had a static termination resistor where the resistance value does not change once it is set—i.e., once the communication system is powered on.

At block 425, the configuration logic determines if the driver receives additional data to be transmitted on the shared bus. If not, method 400 ends. However, if additional data is received, method 400 returns to block 410 to identify the target chip for the new data. If the data is for the same target chip, then the configuration logic does not adjust the termination resistor. Moreover, even if the target chip did change, this does not necessarily mean the configuration logic will adjust the resistance value of the termination resistor. That is, different chips coupled to the shared bus may correspond to the same resistance value. Furthermore, the configuration logic may assign groups of chips on the bus the same resistance value. For example, the three chips closest to the driver may correspond to a first termination resistance value, the next three chips correspond to a second termination resistance value, and so forth. Thus, if the new target chip is within the same group as the previous target chip, the configuration logic does not adjust the resistance value of the termination resistor.

Figure 5:
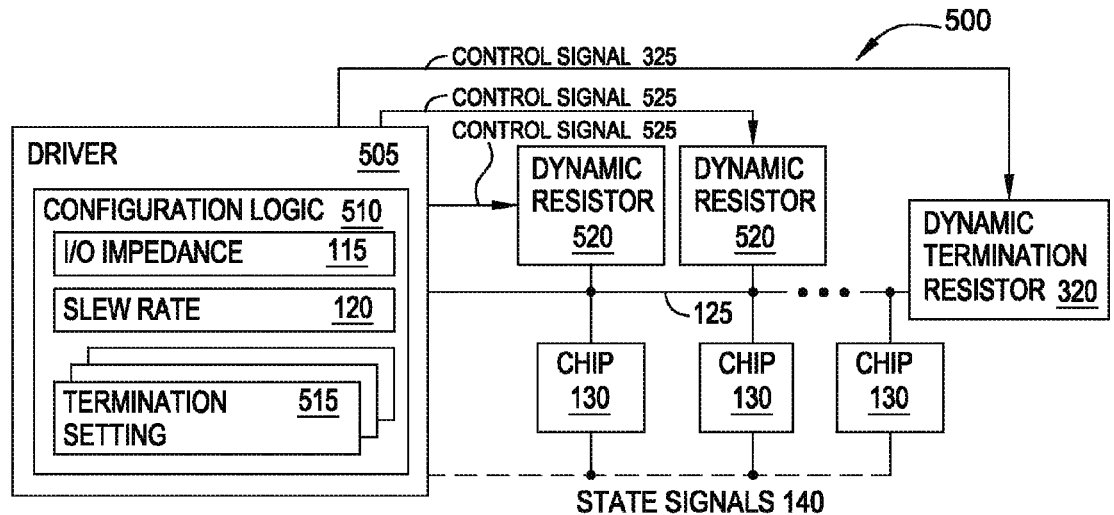
FIG. 5 illustrates a communication system with multiple chips and corresponding dynamic resistors coupled to a shared bus, according to one embodiment described herein.

FIG. 5 illustrates a communication system 500 with multiple chips 130 and corresponding dynamic resistors 520 coupled to a shared bus 125, according to one embodiment described herein. The system 500 includes a driver 505 which transmits data on the shared bus 125 to the chips 130. As above, although all of the chips 130 receive the signal (even if the signal quality is too poor for all the chips to identify the data represented by the signal), the transmitted data may be intended for only a subset of the chips 130—i.e., a target chip or chips.

The system 500 includes multiple dynamic resistors 520 coupled to the shared bus 125. In one embodiment, the system 500 includes a respective dynamic resistor 520 (or termination resistor 320) for each of the chips 130 coupled to the shared bus 125. That is, each chip 130 corresponds to a respective dynamic resistor 520 where the last chip 130 (i.e., the chip 130 furthest from the driver 505) corresponds to the termination resistor 320. Thus, the system 500 includes equal numbers of chips 130 and dynamic resistors (i.e., dynamic resistors 520 and dynamic termination resistor 320).

The system 500 includes control signals 325, 525 to adjust the resistance values of the dynamic resistors 320, 520. Each of these control signals 325, 525 may correspond to an individual communication link (e.g., a trace), or the control signals 325, 525 may be transmitted on a shared link. Regardless, using the control signals 325, 525, the driver 505 can individually adjust the resistance values of the dynamic resistors 320, 520 based on the current target of the data transmitted on the shared bus 125.

Like in communication systems 100 and 300, configuration logic 510 includes I/O impedance 115 and slew rate 120 control settings for the driver 505. However, unlike systems 100 and 300, the configuration logic 510 stores multiple termination settings 515 for multiple dynamic resistors—i.e., resistors 320 and 520. In one embodiment, the configuration logic 510 stores termination settings 515 for each of the chips 130. Depending on which chip 130 is the target chip, the logic 510 can use the corresponding termination settings 515 to set the resistance values for all the dynamic resistors 320, 520. Stated differently, the resistance values for each of the resistors 320 and 520 may change depending on which of the chips 130 is the target. However, although the configuration logic 510 may adjust multiple dynamic resistors 320, 520 depending on the target chip, in another embodiment, the logic 510 may change only the dynamic resistor directly corresponding to the target chip. For example, the driver 505 may use the state signals 140 to deactivate all the non-target chips 130 and use one of the control signals 325, 525 to adjust the dynamic resistor 320, 520 coupled to the same location on the shared bus 125 as the target chip (i.e., the driver 505 does not adjust the dynamic resistors 320, 520 corresponding to the non-target chips). For instance, if the chip 130 furthest from the driver 505 is the target chip, the configuration logic may adjust only the dynamic termination resistor 320 and leave the resistance values for the dynamic resistors 520 unchanged. Furthermore, the driver 505 may deactivate the non-target chips using the state signals 140.

Figure 6:
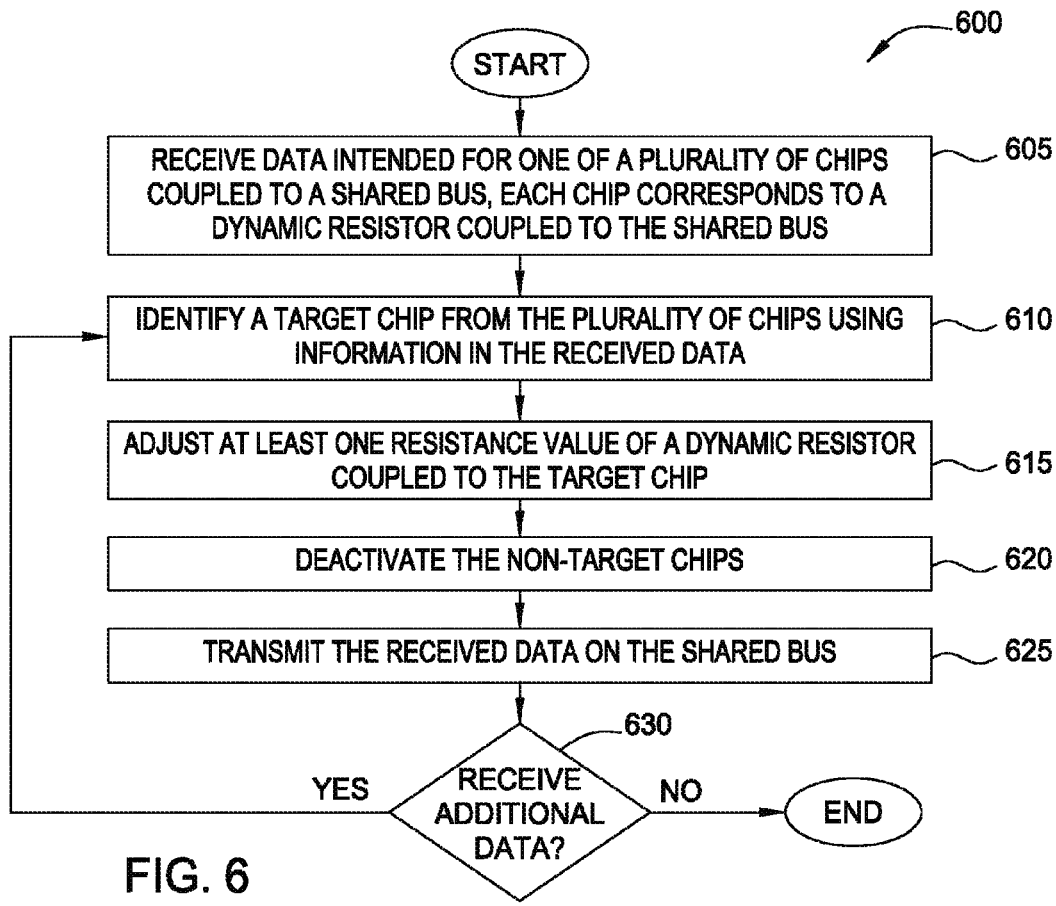
FIG. 6 is a flow chart for adjusting a dynamic resistor corresponding to a target chip on the shared bus, according to one embodiment described herein.

FIG. 6 is a flow chart illustrating a method 600 for adjusting a dynamic resistor corresponding to a target chip on the shared bus, according to one embodiment described herein. Blocks 605 and 615 may be the same as blocks 205 and 210 in FIG. 2, and thus, will not be described in detail here.

At block 615, configuration logic adjusts a resistance value of the dynamic resistor coupled to the target chip. In one embodiment, logic adjusts the resistance value of the dynamic resistor that is closest to a node at which the target chip is coupled to the shared bus. State differently, the configuration logic adjusts the resistance value of the dynamic resistor that has the greatest effect on the signal quality at the location of the target chip on the shared bus. In one embodiment, the dynamic resistor and the target chip are coupled to the same location on the shared bus.

In other embodiments, the configuration logic adjusts the resistance value of multiple dynamic resistors based on determining the target chip for the data transmission. For example, the configuration logic may adjust the resistance values for all the dynamic resistors coupled to the shared bus (which may include a termination resistor) as the target chip changes. The resistance values for the dynamic resistors may be determined during a testing/calibration phase or using a pre-loaded data store.

At block 620, the configuration logic deactivates the non-target chips. In one non-limiting example, the configuration logic sets the non-target chips in a Hi-Z mode. However, any method of deactivating the non-target chips may be used. Furthermore, in some embodiments, the method 600 may omit this step—i.e., the non-target chips may remain active.

At block 625, the driver transmits the received data on the shared bus 625. In one embodiment, the quality of the signal at one or more of the non-target chips on the shared bus may be below receiver thresholds. Thus, these chips may ignore the signal. However, since they are not the target for the transmitted data, this result is acceptable. Moreover, by adjusting one or more of the dynamic resistors in response to identifying the target chip, the transmission data rate may exceed what would be possible if the system has only static resistors or only a dynamic termination resistor.

At block 630, the configuration logic determines if the driver receives additional data to be transmitted on the shared bus. If not, method 600 ends. However, if additional data is received, method 600 returns to block 610 to identify the target chip for the new data. If the data is for the same target chip, then the configuration logic does not adjust the termination resistor. Moreover, even if the target chip did change, this does not necessarily mean the configuration logic will adjust the resistance value(s) of the dynamic resistor(s). That is, different chips coupled to the shared bus may correspond to the same resistance values of the dynamic resistors.

Figure 7A:
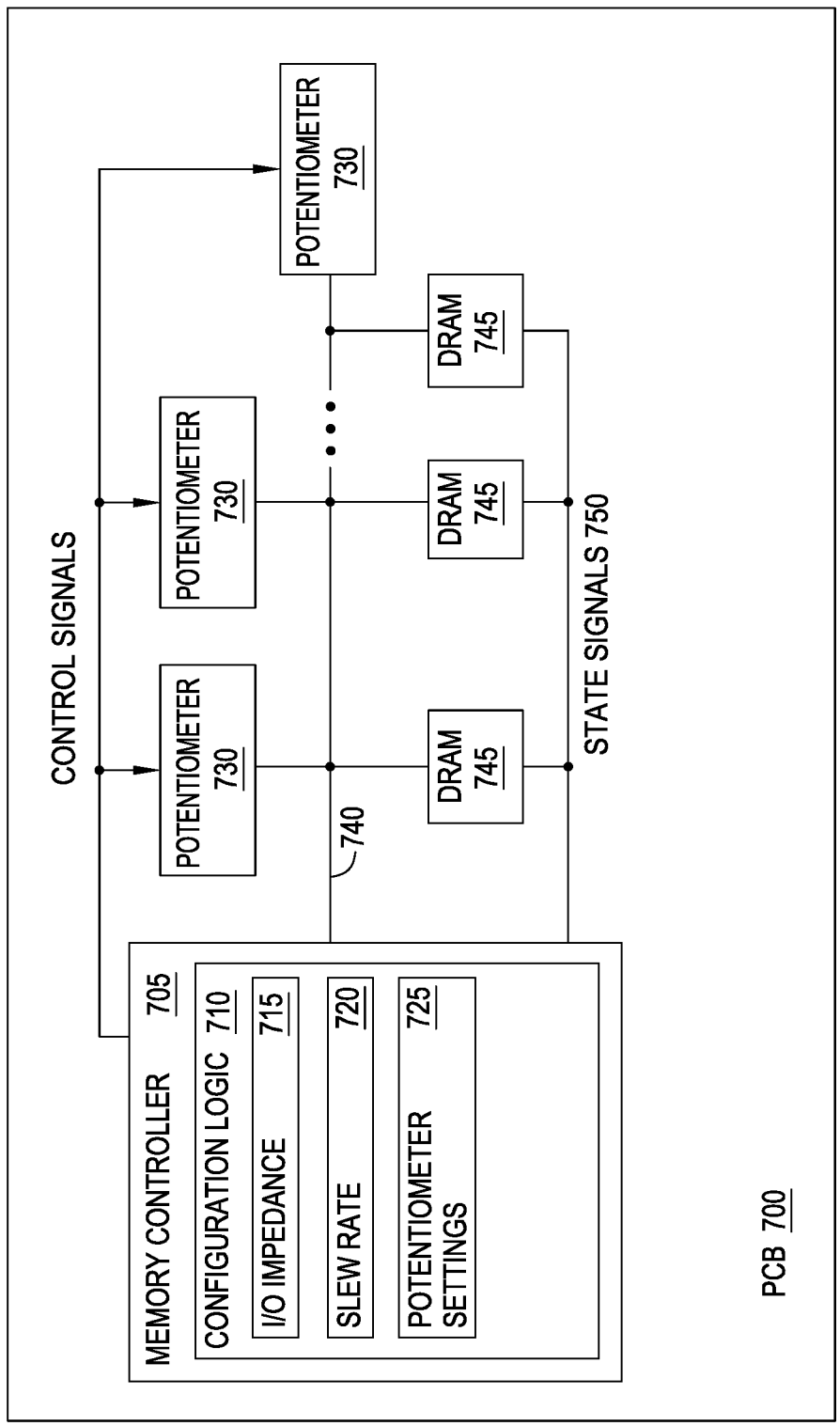
FIGS. 7A and 7B illustrate DRAM memory systems, according to one embodiment described herein.
Figure 7B:
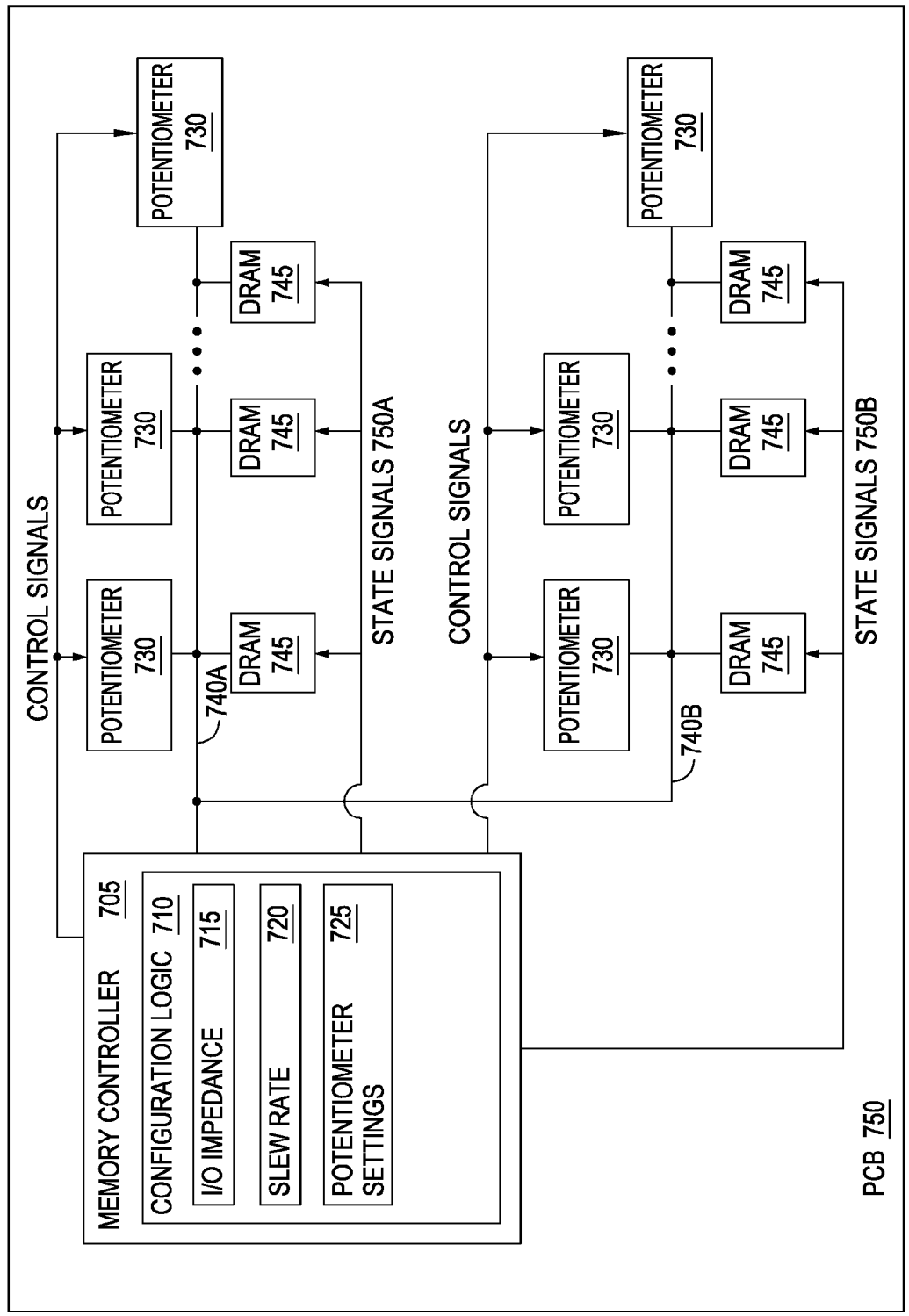

FIGS. 7A and 7B illustrate DRAM memory systems, according to one embodiment described herein. Specifically, FIG. 7A illustrates a printed circuit board (PCB) 700 that includes a memory controller 705, DRAM modules 745, and potentiometers 730 coupled to a shared bus 740. The memory controller 705 may include a driver (not shown) for transmitting received data signals onto the shared bus 740. However, in other embodiments, the driver may be separate from the memory controller 705 (e.g., a separate buffer). In one embodiment, the memory controller 705 and each of the DRAM modules 745 are each separate integrated circuits or chips. Moreover, the potentiometers 730 may also be separate components or may be integrated into the DRAM modules 745.

The memory controller 705 includes configuration logic 710 which may store control settings for driving received data onto the bus 740 as well as resistance values for adjusting the potentiometers 730. In this example, the logic 710 includes I/O impedance 715 and slew rate 720 values which change depending on which DRAM module 745 is the target module. For example, the shared bus 740 may be used to transmit command/address data to the DRAM modules 745. However, the command/address data may be intended for only one of the DRAM modules 745. Thus, if a non-target DRAM module 745 receives the data transmission, the module 745 determines the command/address instruction is intended for a different module and ignores the data. Thus, the configuration logic 710 can adjust the I/O impedance 715 and slew rate 720 to optimize the quality of the transmitted signal at the location of the target DRAM module 745 on the shared bus 740. It does not matter that the signal quality at the other DRAM modules 745 may be too poor for these modules 745 to decode the signal since these modules 745 are not the intended target.

The configuration logic 710 also includes potentiometer settings 725 for adjusting the potentiometers 730 based upon identifying the target DRAM module 745. For example, depending on which DRAM module 745 is the target, the configuration logic 710 may change the resistance values on all of the potentiometers 730. Alternatively, the configuration logic 710 may change the resistance value on only one or some of the potentiometers 730. The PCB 700 also includes state signals 750a, 750b which the configuration logic 710 may use to deactivate the non-target DRAM modules 745. Although the configuration logic 710 in FIG. 7A can adjust the driver control settings, the potentiometers 730, and the state signals 750a 750b each time the target chip changes, in other embodiments, the logic 710 may adjust only a subset of these parameters.

FIG. 7B illustrates a PCB 750 where the DRAM modules 745 are arranged in a split fly-by topology. The shared bus is divided into two portions or legs: first portion 740A and second portion 740B. The first and second portions 740A, 740B are coupled at a first end to a common node that is also connected to the memory controller 705. However, the second ends of each portion 740A, 740B are coupled to different termination resistors (e.g., potentiometers 730). As in the fly-by topology in FIG. 7A, the memory controller 705 transmits received data onto the two portions 740A, 740B simultaneously. The signal representing the transmitted data is received at all the DRAM modules 745 although the signal quality may be too poor for one or more of the DRAM modules 745 to demodulate the signal and recover the data.

As above, the signal quality at the different locations of the DRAM modules 745 along the portions 740A, 740B of the shared bus vary according to the I/O impedance 715, slew rate 720, potentiometer settings 725, and which modules 745 are active/inactive. Upon identifying the target DRAM module 745 for a particular data transmission (e.g., a command/address instruction), the configuration logic 710 may adjust the I/O impedance 715, slew rate 720, potentiometer settings 725, and which modules 745 are active/inactive to optimize the signal quality at the location of the shared bus coupled to the target DRAM module 745. Thus, the techniques and embodiments described herein may apply to the fly-by topology and the split fly-by topology. Moreover, the embodiments herein may also be used to transmit DQ data to a target DRAM module in a memory system that includes multiple loads.

FIG. 8 illustrates a data structure 800 for identifying optimization parameters in a DRAM memory system corresponding to target DRAMs, according to one embodiment described herein. The chart 800 may be referenced by configuration logic in the DRAM memory system each time a new target chip is identified as a recipient for a command/address instruction or for DQ data. Moreover, chart 800 may be formed during a testing phase when the memory system is powered on or may be pre-loaded into the system.

Chart 800 lists possible resistance values of a dynamic termination resistor at row 805 and possible combinations of I/O impedance and slew rate of a driver at row 810. Once the target DRAM module is identified (e.g., DRAM01, DRAM02, etc.), the configuration logic can lookup the corresponding optimization parameters for that module. For example, if the target is DRAM01, the configuration logic adjusts the resistance of the termination resistor to 15 ohms, the I/O impedance of the memory controller (or buffer) to 15 ohms, and the slew rate to 500 ps. In this manner, the memory system is optimized to transmit data to DRAM01 even though doing so may mean that the signal is below receiver thresholds when received at the other DRAM modules (e.g., DRAM02 or DRAM 03).

Moreover, if the memory system includes respective potentiometers that correspond to each of the DRAM modules, the chart 800 may be expanded to include values for these potentiometers. Further, the chart 800 may include values for the state signals 750 shown in FIGS. 7A and 7B to indicate which DRAM modules should be deactivated when transmitting data to a target DRAM module. In one embodiment, the configuration logic may maintain a different chart 800 for each of the data transmission rates the memory system may support since changing the transmission rate may change the optimization parameters for each of the DRAM modules.

In one embodiment, the chart 800 may include optimization parameters for a group of DRAM modules rather than for each DRAM module as shown. For example, in a split fly-by topology, the chart 800 may use the same optimization parameters for all the DRAM modules in the same row of the shared bus. For example, if DRAM01, 02, and 03 were all connected on the same row of the split fly-by net, the optimization parameters may be the same. For example, the optimization parameters may ensure that each DRAM module of the row can accurately receive the data transmission even if that means DRAM modules on a different row on the shared bus cannot.

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A method carried out by a computer processor comprising:
   receiving data to transmit on a shared bus, wherein a plurality of chips is coupled to the shared bus;
   evaluating the received data to identify at least one target chip of the plurality of chips, wherein the target chip is an intended recipient of the received data;
   adjusting a resistance value of a dynamic termination resistor based upon a location of the target chip on the shared bus and by transmitting a control signal on a communication link coupled to the termination resistor, the control signal providing the resistance value to the termination resistor, and wherein the communication link is separate and disconnected from the shared bus, wherein the termination resistor is coupled to a first end of the shared bus and a driver is coupled to a second end of the shared bus opposite the first end; and
   transmitting the received data on the shared bus using the driver and the adjusted resistance value.

2. The method of claim 1, wherein the chips are coupled at different locations to the shared bus such that respective distances between the chips and the driver along the shared bus are different.

3. The method of claim 1, wherein each of the chips comprises a DRAM memory module.

4. The method of claim 1, further comprising, after transmitting the received data on the shared bus:
   receiving new data to transmit on the shared bus;
   evaluating the new received data to identify a new target chip of the plurality of chips;
   changing the resistance value of the termination resistor based upon a location of the new target chip on the shared bus; and transmitting the new received data on the shared bus using the driver and the changed resistance value.

5. The method of claim 1, wherein the driver, shared bus, chips, and termination resistor are arranged in one of a fly-by topology and split fly-by topology.

6. The method of claim 1, further comprising:
evaluating the received data to identify at least one non-target chip of the plurality of chips; and
deactivating the non-target chip before transmitting the received data on the shared bus using the driver.

7. A method carried out by a computer processor comprising:
receiving data to transmit on a shared bus, wherein a plurality of chips is coupled to the shared bus;
evaluating the received data to identify at least one target chip of the plurality of chips, wherein the target chip is an intended recipient of the received data;
adjusting a resistance value of a dynamic termination resistor based upon a location of the target chip on the shared bus and by transmitting a control signal on a communication link coupled to the termination resistor, the control signal providing the resistance value to the termination resistor, and wherein the communication link is separate and disconnected from the shared bus, wherein the termination resistor is coupled to a first end of the shared bus and a driver is coupled to a second end of the shared bus opposite the first end; and
transmitting the received data on the shared bus using the driver and the adjusted resistance value, wherein the dynamic resistor and control driver are coupled on opposite ends of the shared bus, and wherein the plurality of memory chips are in between the driver and the dynamic resistor.

* * * * *